(12) United States Patent
Shida et al.

(10) Patent No.: US 8,817,971 B2
(45) Date of Patent: Aug. 26, 2014

(54) CONFERENCE DEVICE

(75) Inventors: Haruo Shida, Kanagawa (JP);
Nobutake Hayashi, Kanagawa (JP);
Satoshi Odanaka, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 0 days.

(21) Appl. No.: 14/113,712

(22) PCT Filed: Apr. 26, 2012

(86) PCT No.: PCT/JP2012/061694
§ 371 (c)(1),
(2), (4) Date: Oct. 24, 2013

(87) PCT Pub. No.: WO2012/147993
PCT Pub. Date: Nov. 1, 2012

(65) Prior Publication Data
US 2014/0044257 A1 Feb. 13, 2014

(30) Foreign Application Priority Data

Apr. 28, 2011 (JP) ................. 2011-101685

(51) Int. Cl.
| | | |
|---|---|---|
| H04M 1/00 | (2006.01) | |
| H04M 9/00 | (2006.01) | |
| H04R 3/02 | (2006.01) | |
| H05K 7/20 | (2006.01) | |
| H04M 1/02 | (2006.01) | |
| H04M 3/56 | (2006.01) | |
| H04R 27/00 | (2006.01) | |

(52) U.S. Cl.
CPC . *H04M 1/02* (2013.01); *H04R 3/02* (2013.01); *H05K 7/20336* (2013.01); *H04M 3/56* (2013.01); *H04R 27/00* (2013.01)
USPC ............... 379/433.03; 379/433.02; 455/575.1

(58) Field of Classification Search
USPC ....................... 379/433.03, 433.02; 455/575.1
See application file for complete search history.

(56) References Cited

U.S. PATENT DOCUMENTS 5,280,540 A   1/1994  Addeo et al.
6,266,410 B1  7/2001  Takahashi
(Continued)

FOREIGN PATENT DOCUMENTS

EP   0 836 324 A2   4/1998
JP   10-107892      4/1998
(Continued)

OTHER PUBLICATIONS

International Search Report Issued Jul. 17, 2012 in PCT/JP2012/061694 Filed Apr. 26, 2012.

(Continued)

*Primary Examiner* — Alexander Jamal
(74) *Attorney, Agent, or Firm* — Oblon, Spivak, McClelland, Maier & Neustadt, L.L.P.

(57) ABSTRACT

In a video teleconference device, a microphone and a speaker are arranged in a housing in such a manner that a voice input direction of the microphone and a voice output direction of the speaker are roughly orthogonal to each other. With that, the sound coming out of the speaker is not easily received as input by the microphone. Thus, with such a simple configuration, it becomes possible to effectively curb the echo effect and the howling effect.

8 Claims, 10 Drawing Sheets

(56) References Cited

U.S. PATENT DOCUMENTS

| | | | |
|---|---|---|---|
| 6,411,332 B1 | 6/2002 | Whitby et al. | |
| 6,904,298 B2 * | 6/2005 | Arai et al. | 455/556.1 |
| 7,336,775 B2 | 2/2008 | Tanaka et al. | |
| 7,710,497 B2 | 5/2010 | Sukenari et al. | |
| 7,929,050 B2 | 4/2011 | Liang et al. | |
| 2004/0267990 A1 * | 12/2004 | Lin | 710/100 |
| 2007/0107163 A1 | 5/2007 | Barnett | |
| 2010/0188549 A1 | 7/2010 | Ichieda | |
| 2010/0289906 A1 | 11/2010 | Kaye et al. | |
| 2012/0182470 A1 | 7/2012 | Odanaka | |

FOREIGN PATENT DOCUMENTS

| | | |
|---|---|---|
| JP | 10-285569 A | 10/1998 |
| JP | 2001-298654 | 10/2001 |
| JP | 2002-262250 | 9/2002 |
| JP | 2005-184386 | 7/2005 |
| JP | 2006-138972 | 6/2006 |
| JP | 2010-288114 | 12/2010 |
| JP | 2012-054814 | 3/2012 |
| JP | 2012-151521 | 8/2012 |

OTHER PUBLICATIONS

Office Action mailed Dec. 20, 2012 in U.S. Appl. No. 13/337,727.

Notice of Allowance mailed Jun. 10, 2013 in U.S. Appl. No. 13/337,727.

Office Action mailed Aug. 21, 2013 in co-pending U.S. Appl. No. 13/222,312.

Office Action mailed Feb. 26, 2014 in co-pending U.S. Appl. No. 13/448,672.

* cited by examiner

US 8,817,971 B2

CONFERENCE DEVICE

TECHNICAL FIELD

The present invention relates to a conference device, and more specifically relates to a conference device having a communicating unit for communicating at least voice data (sound data) via a communication network.

BACKGROUND ART

Typically, a video teleconference session using two-way communication of images and voice is carried out among a plurality of groups with the use of a plurality of conference devices each equipped with a camera, a microphone, and a speaker.

In such a video teleconference device, the voice or sound from one group is received as input by the microphone of the corresponding conference device and is sent to the teleconference device of other group via Internet (communication network). At the other group, the voice or sound is output from the corresponding speaker. Similarly, the voice or sound from the other group is received as input by the microphone of the corresponding conference device and is sent to the teleconference device of the one group via Internet. At the one group, the voice or sound is output from the corresponding speaker (for example, see Japanese Patent Application Laid-open No. 2002-262250 and Japanese Patent Application Laid-open No. 2006-138972).

However, there is a risk that the voice or sound of the one group that is output from the speaker of the other conference device is again received as input by the microphone of the other conference device, and eventually gets output from the speaker of the one group. Similarly, there is a risk that the voice or sound of the other group that is output from the speaker of the one conference device is again received as input by the microphone of the one conference device, and eventually gets output from the speaker of the other group. That is, there is a risk that the echo effect or the howling effect occurs.

The present invention is made in view of the aforementioned issue and it is an object of the present invention to provide a conference device in which the echo effect or the howling effect can be effectively curbed with a simple configuration.

DISCLOSURE OF INVENTION

A conference device includes a communication unit configured to transmit and receive sound data at least via a communication network, a housing configured to accommodate the communication unit, a microphone configured to input sound as the sound data to be transmitted by the communication unit, and a speaker configured to output sound as the sound data received by the communication unit. The microphone and the speaker are placed in the housing so that a sound input direction of the microphone and a sound output direction of the speaker are substantially orthogonal to each other.

A conference device includes a communication unit configured to transmit and receive sound data at least via a communication network, a housing configured to accommodate the communication unit, the housing having a substantially cubic shape, a microphone configured to input sound as the sound data to be transmitted by the communication unit, and a speaker configured to output sound as the sound data received by the communication unit. A sound inlet opening to inlet the sound which is input from the microphone is formed on a wall of the housing, a sound outlet opening to output the sound which is output from the speaker is formed on another wall of the housing, the wall and the another wall are adjacent to each other.

In the aforementioned conference device, either one of the sound inlet opening and the sound outlet opening may be formed on an upper wall of the housing, and the other one of the sound inlet opening and the sound outlet opening may be formed on a side wall of the housing.

In the aforementioned conference device, at least one of the microphone and the speaker may be attached to the housing via a buffer.

The aforementioned conference device may further include a cooling system configured to cool a heating element in the housing. The cooling system is placed in the housing. The cooling system includes a heat dissipator configured to dissipate heat from the heating element to an outside of the housing, and an air flow generating unit including a fan to generate an air flow which passes through an inside of the housing via the heat dissipator. The sound input direction of the microphone is out of a path of the air flow.

In the aforementioned conference device, the microphone may be spatially isolated from the speaker and the fan in the housing.

In the aforementioned conference device, the housing may comprise a substantially flat plate-like body having a thickness in a vertical direction.

According to an aspect of the present invention, it becomes possible to provide a conference device in which the echo effect or the howling effect can be effectively curbed with a simple configuration.

BEST MODE(S) FOR CARRYING OUT THE INVENTION

An exemplary embodiment of the present invention is described in detail below with reference to FIGS. 1A to 13.

Figure 1A:
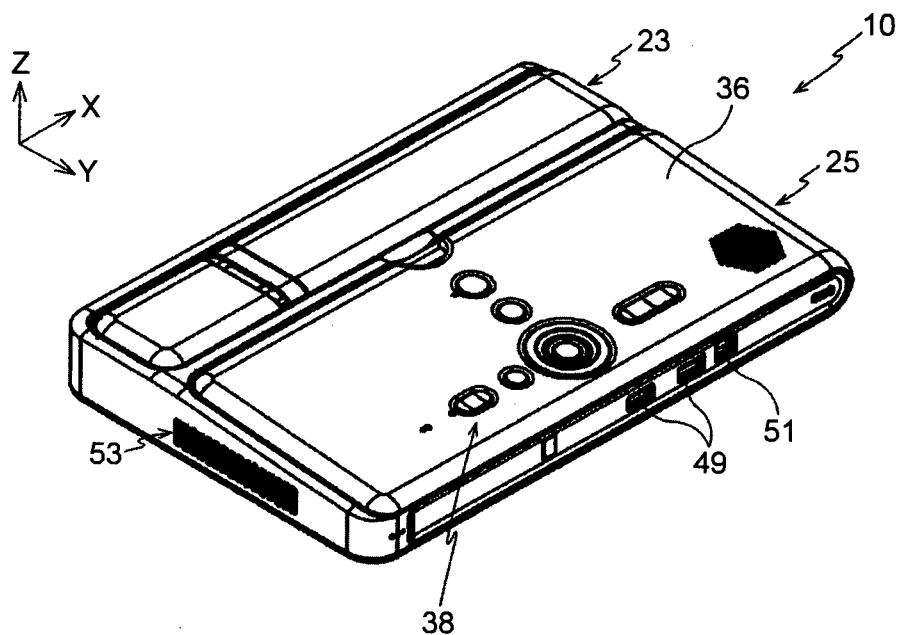
FIGS. 1A and 1B are perspective views illustrating an external appearance, in an unused state, of a video teleconference device according to an embodiment of the present invention.
Figure 1B:
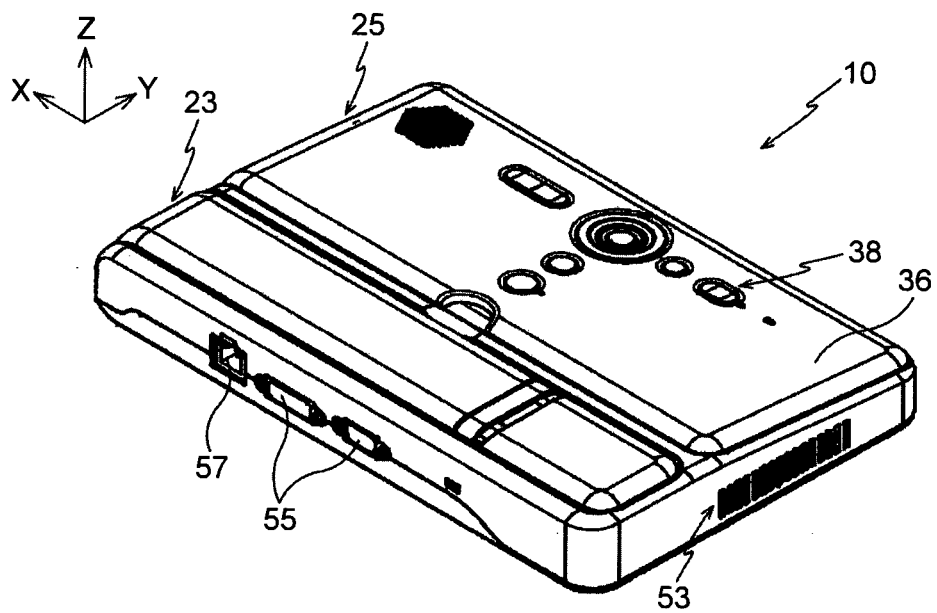

FIGS. 1A and 1B illustrate an external appearance, in an unused state, of a video teleconference device serving as a conference device according to the embodiment of the present invention. As illustrated in FIGS. 1A and 1B, in the unused state, a video teleconference device 10 in entirety has a roughly thin cubic outer shape (substantially a flat plate-like shape). In FIGS. 1A and 1B, the video teleconference device 10 is placed along a horizontal plane on, for example, the top face (mounting face) of a desk or a table. For the sake of explanation, hereinafter, the longitudinal direction of the video teleconference device 10 is referred to as "X direction" along X axis; the direction orthogonal to the X direction within the horizontal plane is referred to as "Y direction" along Y axis; and the direction orthogonal to the X direction and the Y direction (i.e., the vertical direction) is referred to as "Z direction" along Z axis. Furthermore, when an intersection of X axis, Y axis and Z axis, which are depicted in the figures, is assumed as a reference point, the farther or distal side from the reference point may be referred to as +X, +Y, or +Z, while the nearer or proximal side from the reference point may be referred to as −X, −Y and −Z.

Figure 2:
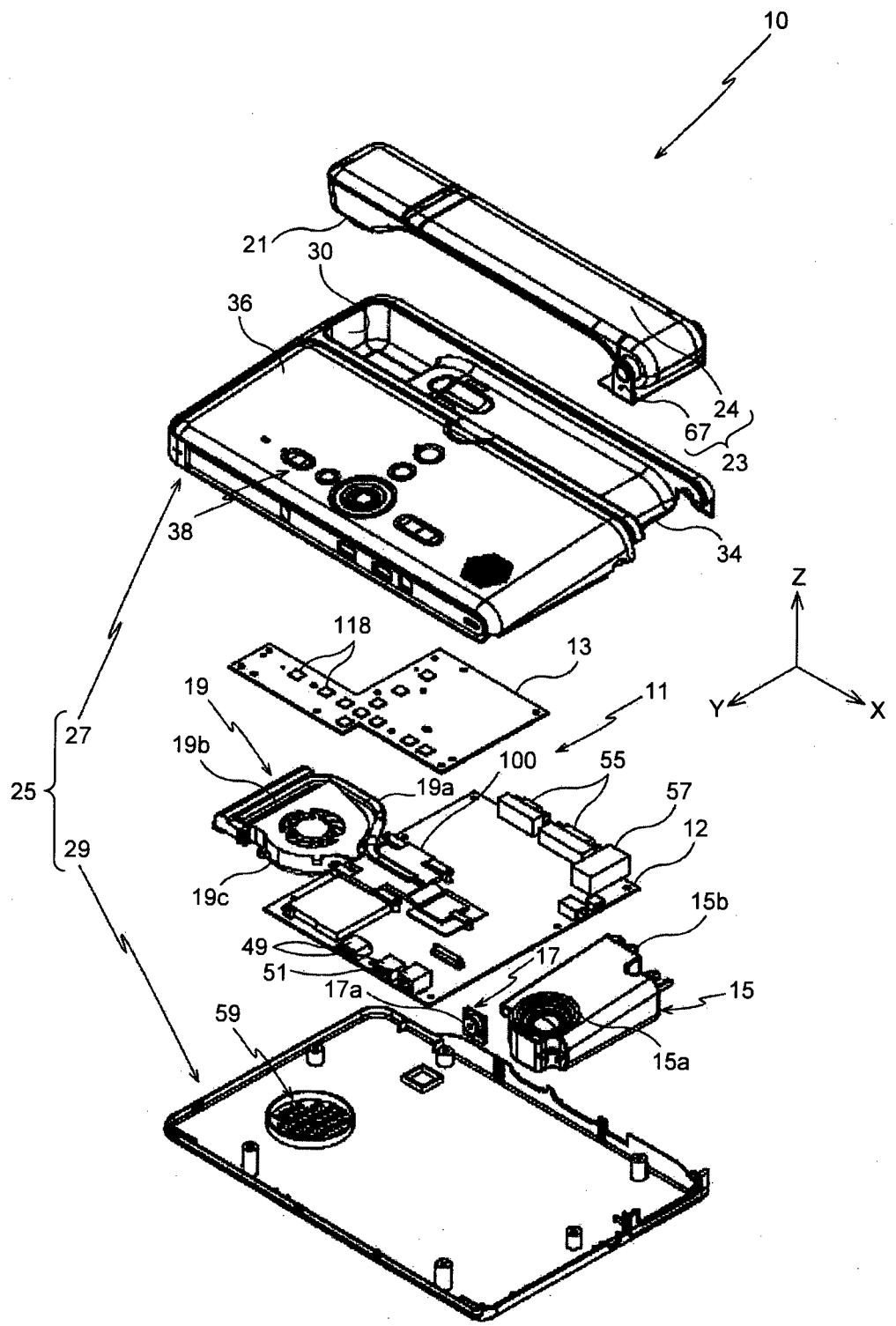
FIG. 2 is an exploded perspective view of the video teleconference device.

FIG. 2 is an exploded perspective view of the video teleconference device 10 illustrated in FIGS. 1A and 1B. As illustrated in FIG. 2, the video teleconference device 10 includes a housing 25; a control device 11; an image input device 23 equipped with an electronic camera 21; a cooling system 19; a voice output device 15 equipped with a speaker 15a; and a voice input device 17 equipped with a microphone 17a.

Figure 3:
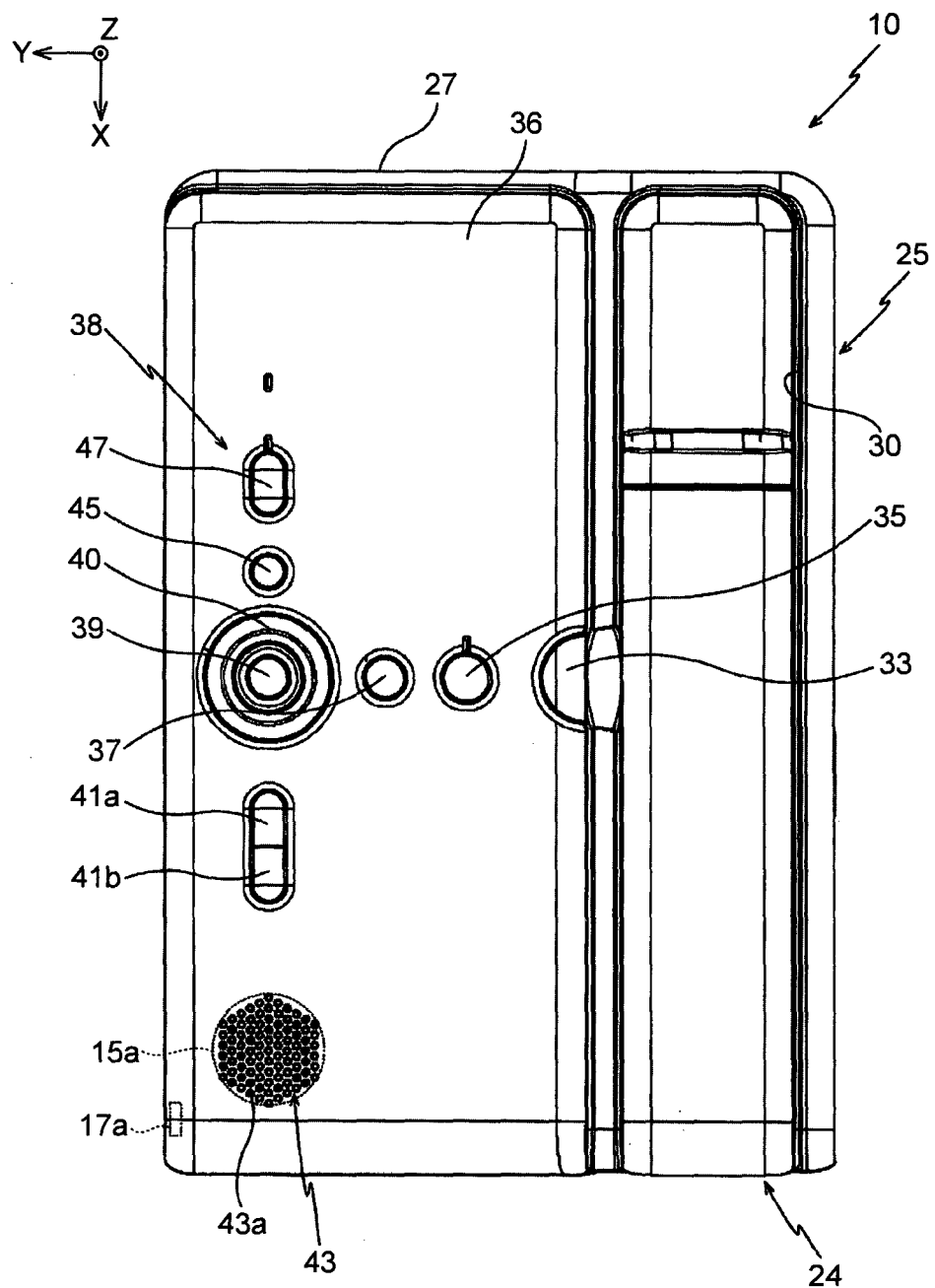
FIG. 3 is a planar view of the video teleconference device.
Figure 4:
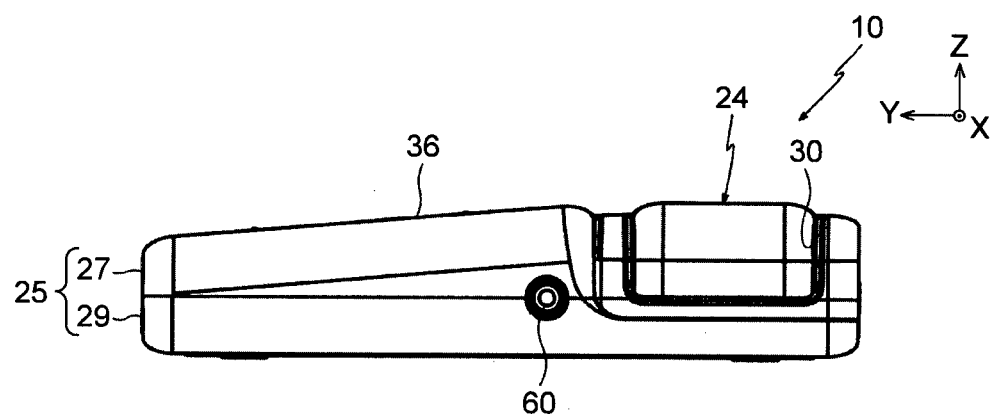
FIG. 4 is a side view (first) of the video teleconference device.
Figure 5:
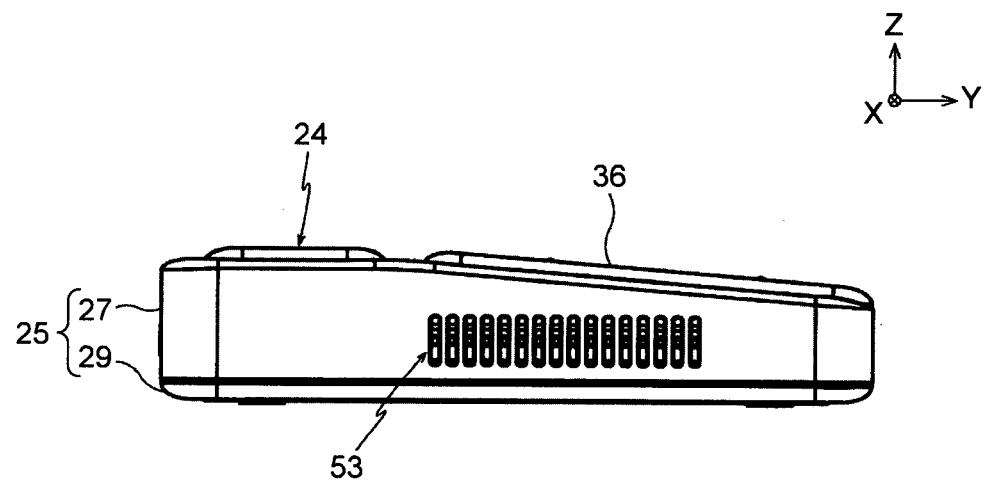
FIG. 5 is a side view (second) of the video teleconference device.

The housing 25 is a thin box-like hollow member (having the shape of a substantially rectangular parallelepiped). As illustrated in FIG. 3, in a planar view, the housing 25 has the outer shape of, for example, an almost A4-sized rectangle. As illustrated in FIGS. 4 and 5, in a side view, the thickness of the housing 25 is, for example, around 20 mm to 45 mm. The housing 25 is made of hard resin such as plastic.

As illustrated in FIG. 2, in the vicinity of the end at the −Y direction side of the upper wall of the housing 25, a concave portion 30 is formed that extends over almost the entire area in the X direction and that is open toward the +Z direction side and the +X direction side with respect to a planar rectangle having the longitudinal direction as X direction. A cut 34 is taken at the end of the +X direction side of a bottom face that defines the concave portion 30.

As illustrated in FIG. 2, the housing 25 comprises an upper cover 27 and a lower cover 29 that are joined together in a detachable manner in the thickness direction (in FIG. 2, the vertical direction) of the housing 25. The upper cover 27 is formed in a thin box shape but its −Z direction side opened. The lower cover 29 is formed in a thin box shape but its +Z direction side opened. On the upper wall of the upper cover 27 (i.e., the upper wall of the housing 25), an operation panel 36 having an operating unit 38 is disposed at the +Y direction side relative to the concave portion 30.

As illustrated in FIG. 3, in the central portion along the X direction of the operation panel 36, a plurality of (e.g., four) operating buttons each constituting a part of the operating unit 38 is fit in. The operating buttons are spaced apart from each other along the Y direction. As those four operating buttons, following buttons are arranged in that order starting from the side on the concave portion 30: a lock releasing button 33 (described later); a power button 35 used in switching ON or switching OFF the power supplied to the video teleconference device 10; a line button 37 used in disconnecting the Internet connection established with another device; and a decision button 39 used in finalizing an item that is selected from a menu screen, which, for example, is displayed on the screen of a liquid crystal monitor, a personal computer (hereinafter, referred to as "PC"), or a liquid crystal television, or is projected on a screen S using a projector P (see FIG. 13). Moreover, in the vicinity of the outer circumference of the decision button 39 that is disposed on the operation panel 36, a cursor 40 that is used in selecting an item from the aforementioned menu screen is fit in to encircle the outer circumference of the decision button 39. The items that can be selected and finalized from the aforementioned menu screen include, for example, the address of another conference device with which a video teleconference session may be planned.

At the +X direction side of the decision button 39 on the operation panel 36, a pair of volume buttons 41a and 41b is arranged to enable adjustment in the volume level of the voice coming out of the speaker 15a (one of the volume buttons is used to increase the volume level, while the other volume button is used to decrease the volume level). The volume buttons 41a and 41b are fit in adjoining to each other along the X direction. At the −X direction side of the decision button 39 on the operation panel 36, a menu button 45 and a microphone mute button 47 are fit in, in this order from the decision button 39. The menu button 45 is used in calling the aforementioned menu screen on, for example, either the screen of a liquid crystal monitor or the screen S (see FIG. 13).

When any one of the operating buttons or cursor mentioned above is operated (pressed), the operated button engages with a member disposed beneath them thereby resulting in realizing the desired function. Particularly, except for the lock releasing button 33, each of the operating buttons mentioned above as well as the cursor 40 is disposed at a position corresponding to one of operating terminals 118, which are mounted on a sub-board 13 (described later). When not in a pressed state, each of the operating buttons mentioned above as well as the cursor 40 has the top face almost flush with the top face of the operation panel 36.

Meanwhile, as can be noted in FIGS. 4 and 5, with respect to the XY plane (i.e., the bottom face of the housing 25), the operation panel 36 is slightly tilted (for example, by 4.6°) in such a way that the +Y direction side is lower than the −Y direction side in its height. Hence, particularly when a user is positioned roughly at the +Y direction side of the housing 25, excellent visibility and operability is achieved regarding the operating members and the cursor 40 mentioned above.

Figure 6:
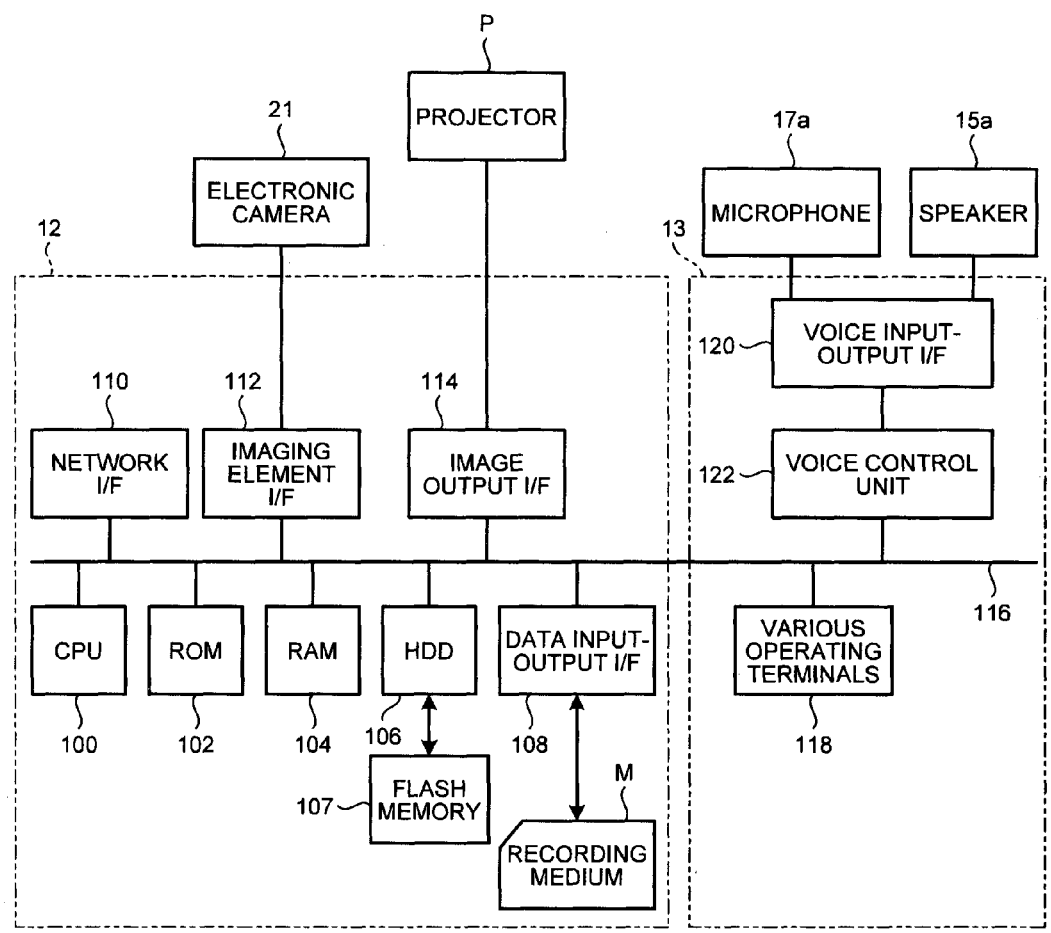
FIG. 6 is a block diagram of a configuration for controlling the video teleconference device.

As illustrated in FIG. 1A, USB (Universal Serial Bus) terminals 49 and 51 are disposed (fit in) in the central portion along the X direction of a side wall at the +Y direction side of the housing 25. The USB terminal 49 is for inputting or outputting the information or data between this device and various external devices, or recording medium M (FIG. 6). The USB terminal 51 is for connecting a PC or the like. The USB terminals 49 and 51 are to be implemented on a main board 12 (described later).

As illustrated in FIG. 1B, a side wall at the −Y direction side of the housing 25 has an image output terminal 55 and a LAN (Local Area Network) terminal 57 for the communication, which are fit in the side wall. The image output terminal 55 and the LAN terminal 57 are to be implemented on the main board 12 (described later). As illustrated in FIG. 4, at a side wall at the +X direction side of the housing 25, a power jack 60 is fit in.

The control device 11 performs encoding/decoding of voice data (sound data) and image data, and controls two-way communication of voice and images via Internet that serves as the communication network.

As illustrated in FIG. 2, the control device 11, which is housed in the housing 25, comprises the main board 12 serving as a control board and the sub-board 13 serving as a board for voice processing and a board for operations.

As illustrated in FIG. 6, on the main board 12; a central processing unit (CPU) 100, a read only memory (ROM) 102, a random access memory (RAM) 104, a hard disk drive (HDD) 106 (or a storage device or a recording device), a data input-output interface (I/F) 108, a network interface (I/F) 110, an imaging element interface (I/F) 112, and an image output interface (I/F) 114 are mounted in a two-way communicable manner via a bus line 116 such as address buses or data buses. Meanwhile, the aforementioned image data may be data for motion picture or intermittent motion picture (still picture changing at an interval).

The CPU 100 controls the entire operations of the video teleconference device 10 based on a predetermined computer program (a video teleconference device program). The ROM 102 is used to store computer programs such as the initial program loader (IPL) that is implemented for driving the CPU 100. The RAM 104 is used as a work area for the CPU 100.

The HDD 106 is used to store the aforementioned video teleconference device program and a variety of data such as image data and voice data (sound data). Meanwhile, instead of the HDD, it is also possible to use a solid state drive (SSD). The aforementioned video teleconference device program can be distributed in a form of an installable or executable file on a computer-readable recording medium such as a flash memory 107. Moreover, the aforementioned video teleconference device program can be stored not in the HDD 106 but in the ROM 102. Under the control of the CPU 100, the HDD 106 controls reading and writing of data performed with respect to itself.

The data input-output I/F 108 includes the USB terminals 49 and 51 mentioned above. Moreover, the data input-output I/F 108 controls reading or writing (storing) of data with respect to the recording medium M such as a flash memory that is connected to the USB terminal 49. The data input-output I/F 108 also controls the transmission of data, which is displayed on the display of the PC connected to the USB terminal 51, to the video teleconference device of the communication counterpart. The recording medium M can be attached to and detached from the USB terminal 49. The recording medium M may be EEPROM (Electrically Erasable and Programmable ROM) or the like, without limited to the flash memory, insofar as it is a non-volatile memory capable of reading and writing (storing) data under the control of the CPU 100.

The network I/F 110 includes the LAN terminal 57 mentioned above (for example, an Ethernet (registered trademark) terminal), and performs inputting/outputting data (image data and video data) via Internet. The imaging element I/F 112 incorporates image signals, which are output by the electronic camera 21, in the predetermined form of image data. Meanwhile, the details of the image input device 23 equipped with the electronic camera 21 are given later.

The image output I/F 114 includes the image output terminal 55 mentioned above. The image output I/F 114 outputs a menu screen which contains destination addresses of counterpart conference devices with which a video teleconference session may be planned, or operational icons for selecting the output signals or for adjusting the image quality. The image output I/F 114 also outputs the encoded image data from among the data received via the communication network. The image output I/F 114 also outputs the image data which is input via the electronic camera 21. These data are output in a predetermined form of analog or digital image signal which is acceptable for the display device such as a liquid crystal monitor or a projector P (see FIG. 13) after converted by the image output I/F 114. Meanwhile, the task of decoding the encoded image data using a predetermined codec is performed by the CPU 100. Herein, the predetermined form of image signals may include analog RGB signals (VGA), component video signals, HDMI (High-Definition Multimedia Interface) signals, and DVI (Digital Video Interactive) signals.

On the sub-board 13, there are mounted various constituent elements such as a plurality of the operating terminals 118, each individually corresponding to one of the operating members mentioned above; a voice input-output interface (I/F) 120; and a voice control unit 122. The operating terminals 118 and the voice control unit 122 are connected to each other in a two-way communicable manner via the bus line 116, as well as connected to the constituent elements mounted on the main board 12 in a two-way communicable manner.

The voice input-output I/F 120 incorporates voice signals, which are received as input by the microphone 17a, as predetermined form of voice data (sound data) and sends that voice data to the voice control unit 122. Moreover, the voice input-output I/F 120 converts voice data, which is received via the network I/F 110 and the voice control unit 122, into voice signals that are reproducible in the speaker 15a. Meanwhile, the details of the voice input device 17 equipped with the microphone 17a and the details of the voice output device 15 equipped with the speaker 15a are given later.

When the pair of volume buttons 41a and 41b is pressed, the voice control unit 122 adjusts the volume level of the voice coming out of the speaker 15a. Moreover, when the microphone mute button 47 is pressed (i.e., switched ON or switched OFF); the voice control unit 122 switches between input/no-input of voice from the microphone 17a.

Furthermore, the voice control unit 122 is also equipped with an echo cancelling function for curbing the echo effect or the howling effect that may occur when, during two-way communication with other video teleconference device, the voice output from the speaker 15a is received as input by the microphone 17a thereby forming a loop of sound waves. Besides, the voice control unit 122 also has a noise reducing function for reducing noise, such as the sound of air conditioning or the operating sound of a fan 19c (described later), that is received as input by the microphone 17a.

Figure 7:
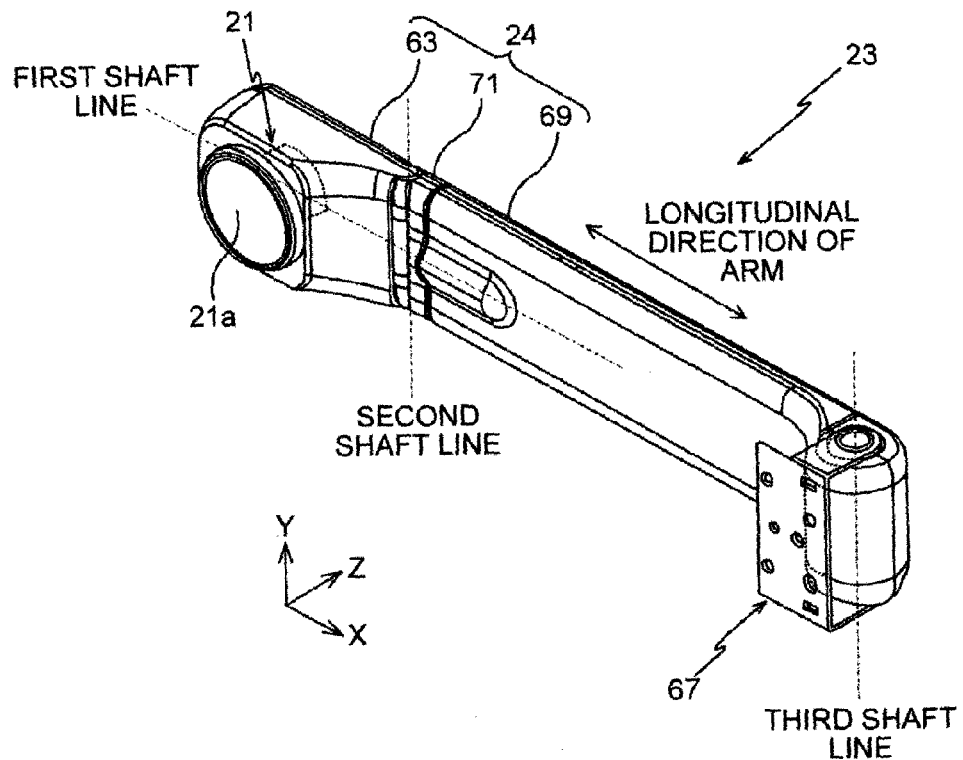
FIG. 7 is a perspective view of an image input device included in the video teleconference device.
Figure 8:
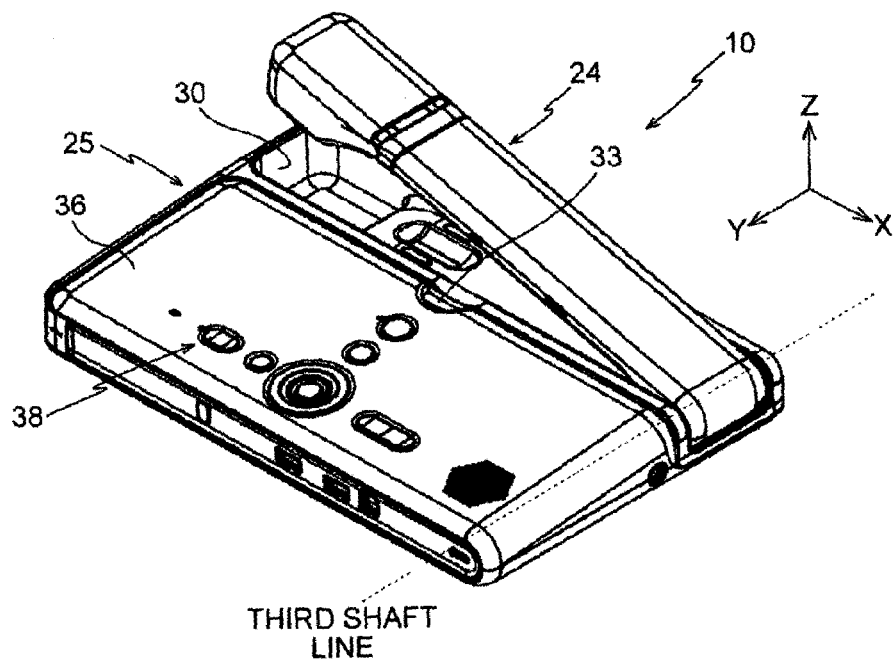
FIG. 8 is a diagram (first) for explaining the operations performed by the image input device.

As illustrated in FIG. 7, the image input device 23 includes an arm 69, an uniaxial hinge device 67 and so on, in addition to the electronic camera 21.

The electronic camera 21 receives input of images of a photographic subject via a photographing lens 21a, converts the received images into electric signals, and outputs the electric signals to the imaging element I/F 112. As the photographing lens 21a, for example, a single-focus wide-angle lens having a short focal length is used. The electronic camera 21 is housed in a hollow camera housing 63 with the photographing lens 21a being exposed to the outside. The camera housing 63 is attached to the leading end (i.e., one of the ends in the longitudinal direction) of the arm 69 via a biaxial hinge device. With respect to the arm 69, the camera housing 63 can relatively rotate around a first shaft line, which extends along the longitudinal direction of the arm 69, and around a second shaft line, which is orthogonal to the first shaft line, in an independent manner. The base end (i.e., the other end in the longitudinal direction) of the arm 69 is connected to the housing 25 via the cut 34 and via the uniaxial hinge device 67 housed in the housing 25. With respect to the housing 25, the arm 69 can relatively rotate around a third shaft line, which extends along the Y axis (see FIGS. 8 and 9). In between the camera housing 63 and the arm 69, there is disposed a cover member 71 that partially covers the biaxial hinge device mentioned above.

In the following explanation, a unit that includes the camera housing 63 having the electronic camera 21 housed therein, includes the arm 69, includes the cover member 71, and includes the biaxial hinge device mentioned above is referred to as an image input unit 24. A state of the image input unit 24 when the relative positioning of the camera housing 63 and the arm 69 around the first shaft line and the second shaft line are as illustrated in FIGS. 2 and 7 is herein called a reference state. In the reference state, the rear face (i.e., the top face in FIG. 2) of the image input unit 24 is flat in entirety.

Due to the action of the uniaxial hinge device 67, the image input unit 24 can rotate around the third shaft line between a housed position, at which the image input unit 24 is housed in the housing 25 via the concave portion 30 and the cut 34, and a projected position, at which the image input unit 24 projects to the outside of the housing 25 from the housed position. When the image input unit 24 is placed at the housed position, at least a part of the lower face of the image input unit 24 is placed on the bottom face of the concave portion 30 that defines the concave portion 30, and the rear face (top face) of the image input unit 24 lies at almost the same height as the top face of the operation panel 36 at the −Y direction side end. The rotation angle around the third shaft line of the image input unit 24 relative to the housing 25 is mechanically defined, for example, in a range of 0 to 135 degrees (inclusive boundary values) under the condition that the rotation angle at the housed position is assumed as 0 degree. Furthermore, as illustrated in FIG. 3, the image input unit 24 substantially fits in the concave portion 30 relative to the X direction and the Y direction, when it is in the housed position.

The image input unit 24 is biased from the housed position to the projected position by an elastic member arranged to the uniaxial hinge device 67. The image input unit 24 is mechanically latched or locked to the housing 25 at the housed position by the lock device including the aforementioned lock release button 33, when rotating to the housed position from the projected position. If the lock release button 33 is operated (pressed) when the image input unit 24 is in the housed position, the mechanically lock to the housing 25 by the lock device is released. Thus, the unit 24 rotates from the housed position to the projected position by the predetermined angle (e.g. 15 degrees), by an action of the elastic member. Namely, the uniaxial hinge device 67 has a popup function to popup the image input unit 24 from the housing 25 by the action of the elastic member.

The image input unit 24 can be maintained at any position within a predetermined range (e.g. a position within 45 to 135 degrees (inclusive boundary values) of the rotation angle) relative to the housing 25 around the third shaft line, by an action of a maintain torque generating unit arranged to the uniaxial hinge device 67. Also in the image input unit 24, the camera housing 63 can be maintained at any position within a predetermined range relative to the arm 69 around the first and second shaft lines, respectively, by an action of a maintain torque generating unit arranged to the biaxial hinge device.

The cooling system 19 cools a heating element such as the CPU 100 mounted on the main board 12 of the control device 11 by releasing the heat, which is generated from the heating element, to the outside of the housing 25. For that, the cooling system 19 has a configuration described below.

As illustrated in FIG. 2, the cooling system 19 includes a heat pipe 19a, a heat sink 19b, and the transverse-mounted fan 19c that are housed inside the housing 25.

Herein, as illustrated in FIG. 5, in the central portion along the Y direction of a side wall of the housing 25 which is located at the −X direction side along the Y direction, an exhaust outlet 53 is formed from a number of slit-like through holes that extend in the Z direction and that are arranged in the Y direction. Moreover, as illustrated in FIG. 2, in the vicinity of the end at the −X direction side of the lower wall of the housing 25 (i.e., the lower wall of the lower cover 29), an air inlet 59 is formed from a number of through holes.

For example, one end of the heat pipe 19a is connected to the CPU 100, the other end of the heat pipe 19a is connected to the heat sink 19b, and the middle part of the heat pipe 19a extends along the XY plane. The heat sink 19b is made of, for example, a heat dissipating member as the heat dissipator that includes a plurality of metallic fins arranged at predetermined intervals in the Y direction. The heat sink 19b is positioned adjoining the exhaust outlet 53 that is formed in the housing 25. Thus, the heat generated by, for example, the CPU 100 reaches the heat pipe 19a and the heat sink 19b in that order, and is then released through the exhaust outlet 53 to the outside of the housing 25.

The fan 19c has an air channelizing function (air flow generating function) and is positioned in the housing 25, immediately above the air inlet 59 and in the vicinity of the +X direction side of the heat sink 19b, so that the air inlet direction orients roughly the +Z direction and the air outlet direction orients roughly the −X direction.

Thus, the air taken in by the fan 19c through the air inlet 59 passes through the heat sink 19b and gets released to the outside of the housing 25 through the exhaust outlet 53. That enhances the effect of discharging (diffusing) the heat from the heat sink 19b.

As illustrated in FIG. 2, the voice output device 15 includes the speaker 15a as well as includes a speaker box 15b that is, for example, a box-like hollow member.

Herein, as the speaker 15a, for example, a round-shaped full range type speaker is used. The speaker 15a is connected to the voice input-output I/F 120 by means of wire connection, and outputs the voice signals, which are transmitted by the voice input-output I/F 120, in the form of voice (see FIG. 6).

Figure 10:
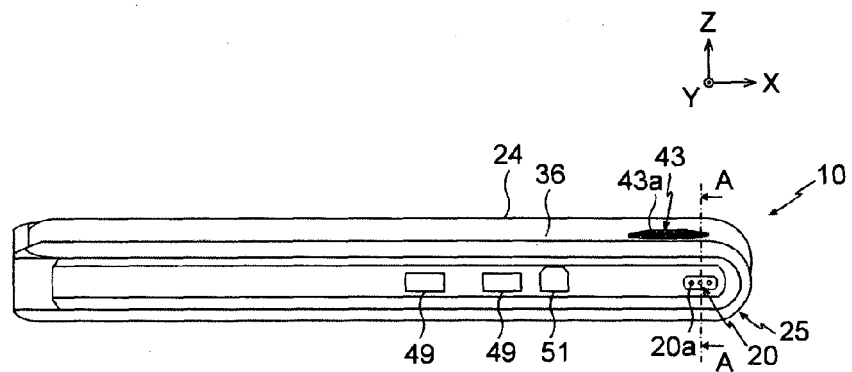
FIG. 10 is a front view of the video teleconference device.
Figure 11:
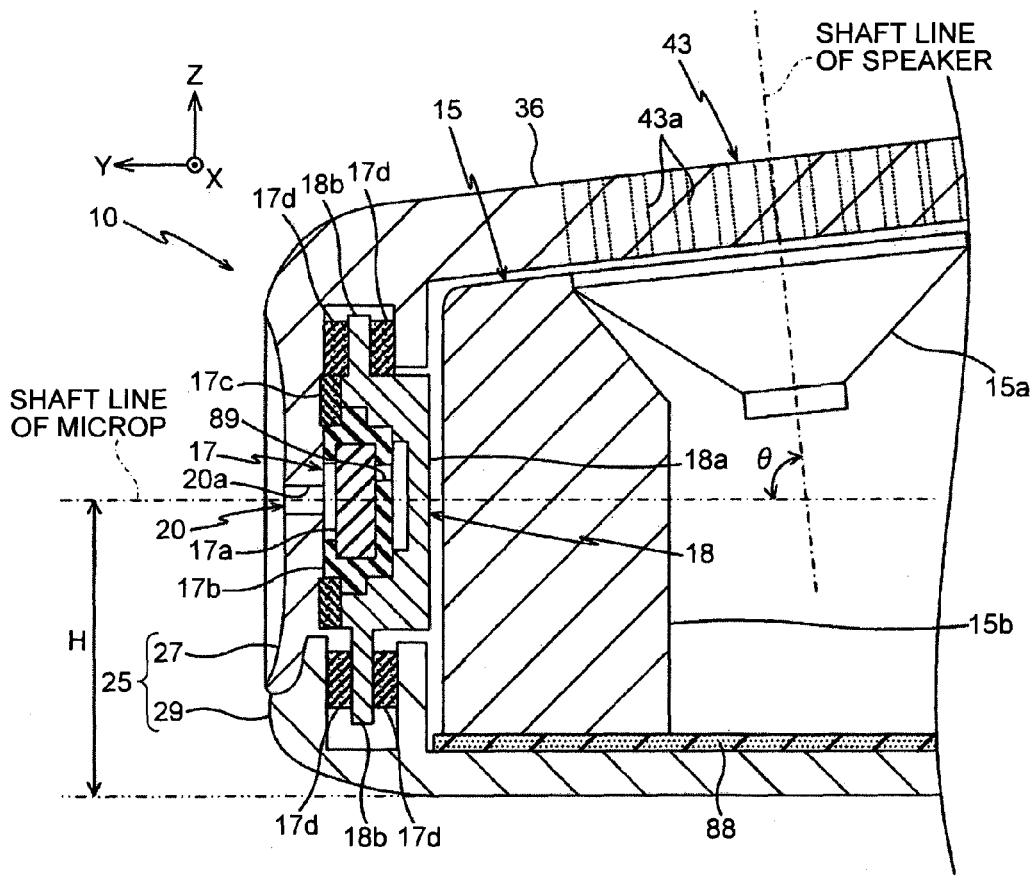
FIG. 11 is a partial cross-sectional view along line A-A illustrated in FIG. 10.

FIG. 10 is a front view (when viewed from the +Y direction) of the video teleconference device 10. FIG. 11 is a partial cross-sectional view along line A-A illustrated in FIG. 10. As illustrated in FIG. 11, the speaker 15a is fit in at the top panel of the speaker box 15b in such a way that the shaft line of the speaker 15a is orthogonal to the operation panel 36, that is, the voice output direction of the speaker 15a is roughly upward (including obliquely upward).

As illustrated in FIGS. 3 and 10, at the corner between the sides in the +X direction and the +Y direction of the operation panel 36, a voice discharging opening 43 as the sound outlet opening is formed from a plurality of through holes 43a. The voice discharging opening 43 discharges the sound that is output from the speaker 15a to the outside. As can be noted in FIG. 3, the through holes 43a constituting the voice discharging opening 43 are densely formed within a virtual frame having a hexagonal shape in a planar view. However, that is not the only possible case. Alternatively, for example, in a planar view, the through holes 43a can be densely formed within a virtual frame having a polygonal shape (other than the hexagonal shape), a round shape, or an elliptical shape. In the voice discharging opening 43; the size, the number, and the density of the through holes 43a within the virtual frame are properly set according to the performance of the voice output device 15 equipped with the speaker 15a.

As illustrated in FIG. 2, the speaker box 15b is placed at the +X direction side end of the housing 25 and at a location at the lower side of the operation panel 36 in such a way that the speaker 15a gets positioned directly beneath the voice discharging opening 43. More specifically, the shaft line of the speaker 15a passes through the center of the voice discharging opening 43 (i.e., passes through the center of the aforementioned hexagonal virtual frame in a planar view). Moreover, as illustrated in FIG. 11, each through hole 43a that constitutes the voice discharging opening 43 extends in the direction orthogonal to the operation panel 36, that is, extends in the direction parallel to the shaft line of the speaker 15a.

As a result, without suffering from vignetting at the through holes 43a, the voice coming out of the speaker 15a is released to the outside of the housing 25 via the voice discharging opening 43 in a smooth manner (i.e., without getting blurred).

The speaker box 15b is fixed to the housing 25 via a shock-absorbing member 88 as a buffer that is made of an elastic material such as silicone rubber or polyurethane rubber. Hence, the voice coming out of the speaker 15a is prevented from reaching the housing 25. As a result, a chattering sound is prevented from occurring in the housing 25, as well as the voice coming out of the speaker 15a is prevented from entering the microphone 17a via the housing 25.

Figure 12A:
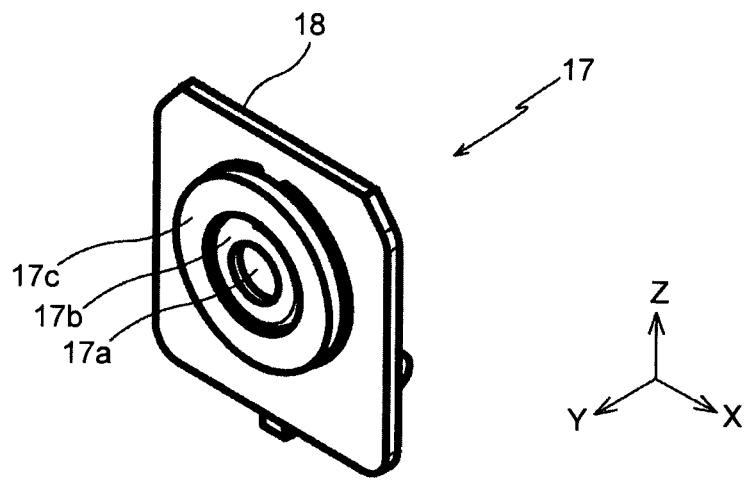
FIG. 12A is a perspective view of a voice input device included in the video teleconference device.

As illustrated in FIG. 12A, the voice input device 17 not only includes the microphone 17a but also includes a holding member 18 that holds the microphone 17a in the housing 25.

Herein, as the microphone 17a, for example, a compact omnidirectional microphone is used. The microphone 17a is connected to the voice input-output I/F 120 by means of wire connection; and transmits the voice, which is input thereto, in the form of voice signals to the voice input-output I/F 120 (see FIG. 6).

Figure 12B:
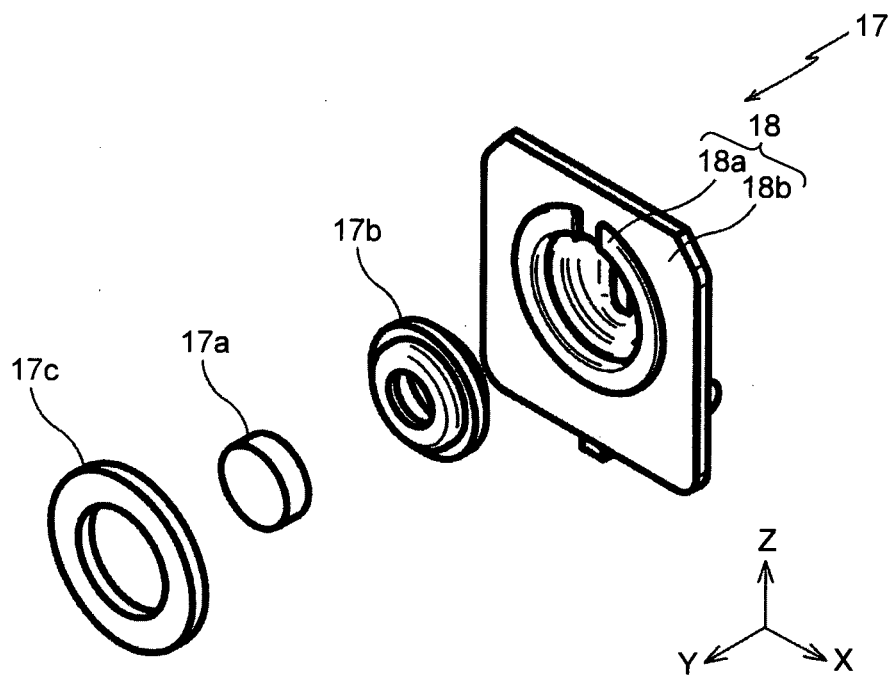
FIG. 12B is an exploded perspective view of the voice input device included in the video teleconference device.

As illustrated in FIG. 12B, the microphone 17a is made of, for example, a thin (low in height) columnar member. As can be summed up from FIGS. 3 and 11, the microphone 17a is disposed obliquely downward of the +Y direction side of the speaker 15a in the housing 25, so that the shaft line of the microphone 17a virtually lies parallel to the Y axis, that is, the voice input direction of the microphone 17a is roughly in the −Y direction.

As illustrated in FIG. 11, the holding member 18 includes a bottomed tubular portion 18a having its shaft line along the Y direction and its opening toward the +Y direction. The holding member 18 further includes a flange 18b that protrudes outward in the radial direction of the tubular portion 18a from the tubular portion 18a in the vicinity of the +Y direction end (opening end) of the tubular portion 18a. Herein, the holding member 18 may be made of, for example, a hard resin such as plastic. However, that is particularly not the only possible case.

The microphone 17a is covered with a holder 17b in its entirely except the central portion of the +Y direction side surface and the part of the −Y direction side surface. The holder 17b is a tubular member having its shaft line along the Y direction, made of soft resin such as rubber or urethane. Thus, the microphone 17a is tightly held (see FIGS. 12A and 12B).

The −Y direction side of the holder 17b is engaged in the inner periphery of the tubular portion 18a of the holding member 18. The +Y direction side of the holder 17b projects toward the +Y direction from the end at the +Y direction side of the holding member 18. A through hole 89 is formed on a side wall of the holder 17b which is located at the −Y direction side of the holder 17b. The through hole 89 is for passing through the wiring to connect the microphone 17a and the voice input-output I/F 120.

The flange 18b is fixed to the housing 25 via a shock-absorbing member 17d as a buffer made of, for example, sponge, rubber, urethane or the like, so that the +Y direction side of the holder 17b abuts on the +Y direction side wall of the housing 25.

The +Y direction side end (opening end) of the tubular portion 18a abuts on the +Y direction side wall of the housing 25 via the ring-shaped shock-absorbing member 17c as a buffer. The +Y direction side of the holder 17b is inserted into the inner periphery of the ring-shaped shock-absorbing member 17c (see FIGS. 12A and 12B). The ring-shaped shock-absorbing member 17c may be made of materials such as sponge, rubber, urethane, and the like.

As described above, the microphone 17a is covered with the holding member 18 and the holder 17b at its +Y direction side surface entirely except the central portion thereof (see FIG. 12A). Furthermore, the +Y direction side of the holder 17b, which covers around the +Y direction side surface of the microphone 17a, abuts on the inner surface of the +Y direction side wall of the housing 25 (see FIG. 11). Thereby, a space where the microphone 17a is located is physically or geometrically isolated from a space where the voice output device 15 is located and a space where the cooling system 19 is located, in the housing 25.

A voice incorporating opening 20 as the sound inlet opening is formed at a position on the +Y direction side wall of the housing 25 which corresponds to the central portion of the +Y direction side surface of the microphone 17a (the portion without covered with the holder 17b). As shown in FIG. 10, the voice incorporating opening 20 is composed of a plurality of (e.g. three) through holes 20a, which are formed at a predetermined interval (equal interval) along the X direction. Namely, as understood from FIG. 11, the space where the microphone 17a is located in the housing 25 is connected to the outside of the housing 25 through the voice incorporating opening 20. Three through holes 20a extend parallel to the shaft line of the microphone 17a (i.e. parallel to the Y direction), respectively. The shaft line of the microphone 17a may pass through the center of the central through hole 20a from among three through holes 20a, i.e. the center of the voice incorporating opening 20. Incidentally, the voice incorporating opening may be sufficiently composed of at least one through hole. Regardless of the number of through holes, it is preferable that the shaft line of the microphone 17a passes through the center of the voice incorporating opening 20. The center of the voice incorporating opening 20 means a center of the central through hole when the voice incorporating opening 20 is composed of odd numbers of through holes arranged at an equal interval in the X direction, or means a center of a through hole when the voice incorporating opening is composed of only one hole. Alternatively, the center of the voice incorporating opening 20 means a midpoint of a line connecting centers of the central two through holes when the voice incorporating opening is composed of even numbers of through holes arranged in the X direction, or a midpoint of a line connecting centers of two through holes when the voice incorporating opening is composed of only two through holes.

Therefore, the sound generated outside of the housing 25 (especially, the voice of a person positioned roughly at the +Y side of the video conference device) is received as input smoothly from the voice incorporating opening 20.

As illustrated in FIG. 11, with respect to the housing 25, the height position of the microphone 17a is set in such a manner than the shaft line thereof lies at a height H of 20 mm or less (for example, 16 mm) from the lower face of the housing 25. With that, it becomes possible to prevent a situation in which the direct sound received as input by the microphone 17a (i.e., the voice input directly from the utterer) and the reflected sound received as input by the microphone 17a (i.e., the sound obtained when the voice of the utterer gets reflected from the mounting face of the housing 25) are received as input by the microphone 17a with a phase difference of a one-half wavelength, and result in cancelling out each other.

Herein, even if the noise within a predetermined range of frequency, such as the normal level of operating sound of the fan 19c or the normal level of sound leaking from the voice output device 15 inside the housing 25, is received as input by the microphone 17a either directly or via the housing 25; that noise gets reduced because of the noise reducing function of the voice control unit 122. Hence, such noise is prevented from being transmitted to the video teleconference device on the other side of communication.

However, if the noise outside the aforementioned predetermined range of frequency (for example, an extremely high-pitched sound or an extremely low-pitched sound), such as an abnormal level of operating sound that is sometimes generated in the fan 19c or an abnormal level of sound leaking from the voice output device 15 inside the housing 25, is received as input by the microphone 17a either directly or via the housing 25; that noise cannot be reduced by the voice control unit 122. Hence, such noise gets transmitted to the video teleconference device on the other side of communication and gets output from the speaker of that video teleconference device.

In that regard, in the present embodiment, as described above, the holding member 18, the holder 17b, and the side wall at the +Y direction side of the housing 25 isolate physically or geometrically the space where the microphone 17a is positioned from the space where the voice output device 15 is located and the space where the cooling system 19 is located, in the housing 25. As a result, the noise within the aforementioned predetermined range of frequency as well as the noise outside the aforementioned predetermined range of frequency is prevented from being directly received as input by the microphone 17a.

Moreover, as described above, since the holding member 18 is held in the housing 25 via the shock-absorbing members 17c and 17d as buffers, the noise within the aforementioned predetermined range of frequency as well as the noise outside the aforementioned predetermined range of frequency is prevented from being received as input by the microphone 17a via the housing 25.

Furthermore, as described above, since the microphone 17a is sandwiched between the housing 25 and the holding member 18 via the holder 17b; the backlash of the microphone 17a with respect to the housing 25 and the holding member 18 is prevented, and the noise within the aforementioned predetermined range of frequency as well as the noise outside the aforementioned predetermined range of frequency is prevented from being received as input by the microphone 17a via at least one of the housing 25 and the holding member 18.

Herein, even when a sound having a magnitude smaller than a predetermined value is output from the speaker 15a to the outside of the housing 25 or a sound within a predetermined range of frequency (such as the voice during a normal conversation) output from the speaker 15a to the outside of the housing 25 is received as input by the microphone 17a, the voice control unit 122 equipped with the echo cancelling function can curb the echo effect or the howling effect.

However, if a sound having a magnitude greater than the aforementioned predetermined value (including a sudden sound such as loud voice, throat clearing, sneezing, or impact sound) is output from the speaker 15a to the outside of the housing 25 or a sound outside the aforementioned predetermined range of frequency (for example, an extremely high-pitched sound or an extremely low-pitched sound) output from the speaker 15a to the outside of the housing 25 is received as input by the microphone 17a, there is a risk that the voice control unit 122 is not able to curb the echo effect or the howling effect.

In order to effectively (sufficiently) curb the echo effect or the howling effect, it is desirable that the sound coming out of the speaker 15a is not received as input by the microphone 17a as much as possible. On the other hand, it is obviously desirable to ensure that the voices of the members participating in a video teleconference session (members participating in the conference) are easily received as input by the microphone 17a and to ensure that the voice coming out of the speaker 15a can be easily heard by the members participating in the video teleconference session.

As described earlier, in the present embodiment, on the upper wall of the housing 25 (i.e., on the operation panel 36), the voice discharging opening 43 is formed to discharge the voice that has been output from the speaker 15a; while on the side wall on the side in the +Y direction that is roughly orthogonal to (lying next to) the upper wall of the housing 25, the voice incorporating opening 20 is formed to incorporate the voice that is then received as input by the microphone 17a.

In such a configuration, the voice that is output from the speaker 15a and that is discharged from the voice discharging opening 43 is not easily received as input by the microphone 17a via the voice incorporating opening 20. That makes it possible to effectively curb the echo effect or the howling effect.

Moreover, in the present embodiment, the speaker 15a and the microphone 17a are arranged with respect to the housing 25 in such a manner that the projected image on a predetermined plane (YZ plane) of the shaft line of the speaker 15a and the projected image on a predetermined plane (YZ plane) of the shaft line of the microphone 17a are roughly orthogonal to each other. Herein, "roughly orthogonal" indicates that an angle θ formed between the projected images (see FIG. 11) is within a range of, for example, 80° or more and 100° or less.

In other words, in the present embodiment, the speaker 15a and the microphone 17a are so arranged in the housing 25 that the voice output direction of the speaker 15a and the voice input direction of the microphone 17a are roughly orthogonal to each other.

More particularly, the speaker 15a is disposed with respect to the housing 25 in such a way that the voice output direction of the speaker 15a is roughly upward (including obliquely upward); while the microphone 17a is disposed with respect to the housing 25 in such a way that the voice input direction of the microphone 17a is roughly in the −Y direction.

With such a configuration, the voice that is output from the speaker 15a is not easily received as input by the microphone 17a. That makes it possible to effectively curb the echo effect or the howling effect.

Moreover, in the present embodiment, the microphone 17a is disposed obliquely downward of the speaker 15a. With that, the microphone 17a gets positioned away from the voice output direction of the speaker 15a.

As described above, since the voice output direction of the speaker 15a is roughly upward (including obliquely upward), a person located at any position around the video teleconference device 10 can easily hear the voice output from the speaker 15a. Moreover, as described above, since the voice input direction of the microphone 17a is roughly in the −Y direction, the voice of a person positioned on roughly at the +Y direction side of the video teleconference device 10 can be extremely easily received as input by the microphone 17a.

Thus, if the members participating in the conference are positioned roughly at the +Y direction side of the video teleconference device 10, the voices of the those members can be extremely easily received as input by the microphone 17a, and the voice output from the speaker 15a can be easily heard by the members.

In the present embodiment, as understood from FIG. 11, the speaker 15a is slightly tilted (for example, by 4.6°) with respect to the XY plane in such a manner that the +Y direction side is lower than the −Y direction side in its height. In other words, the angle θ formed between the projected images on a predetermined plane (YZ plane) of the shaft lines of the speaker 15a and the microphone 17a is set to, for example, 85.4°. That is, the angle θ formed between the plane parallel to the XY plane including the shaft line of the microphone 17a and the plane orthogonal to the YZ plane including the shaft line of the speaker 15a is set to, for example, 85.4°. Meanwhile, the angle of gradient (of 4.6°) of the speaker 15a is same as the angle of gradient of the operation panel 36.

Thus, if the members participating in the conference are positioned roughly at the +Y direction side of the video teleconference device 10, the voice input direction of the microphone 17a and the voice output direction of the speaker 15a is roughly oriented toward those members. Hence, the voices of those members can be extremely easily received as input by the microphone 17a, and the voice output from the speaker 15a can be extremely easily heard by the members.

Thus, the video teleconference device 10 is designed with an eye on capitalizing on the functions of the microphone 17a and the speaker 15a as well as effectively curbing the echo effect or the howling effect.

Moreover, as described above, in the present embodiment, the air inlet 59 is formed in the vicinity of the end at −X direction side of the lower wall of the housing 25, that is, formed at a position of the −X direction side, the −Y direction side, and the −Z direction side of the microphone 17a; and the direction in which the fan 19c takes in the air through the air inlet 59 is the +Z direction. Thus, the path in which the air is taken in inside the housing 25 is positioned away from the voice input direction of the microphone 17a. Furthermore, the exhaust outlet 53 is formed in the middle part along the Y direction of the side wall at the −X direction side of the housing 25, that is, formed at a position at the −X direction side and the −Y direction side of the microphone 17a; and the direction in which the fan 19c lets out the air through the exhaust outlet 53 is the −X direction. Thus, the path in which the air is let out of the housing 25 is positioned away from the voice input direction of the microphone 17a.

Therefore, the suction noise of the fan 19c (including the wind roar at the air inlet 59) as well as the exhaust sound of the fan 19c (including the wind roar at the exhaust outlet 53) is not easily received as input by the microphone 17a. As a result, the suction noise and the exhaust sound of the fan 19c is effectively prevented from being transmitted as noise to the video teleconference device on the other side of communication.

Explained below is an example of a video teleconference session carried out by using the video teleconference devices 10 configured in the manner described above. Herein, it is assumed that the video teleconference session is carried out between a plurality of groups, each having a plurality of members and each using a single video teleconference device 10. Thus, the following explanation is applicable to each of those groups.

Figure 13:
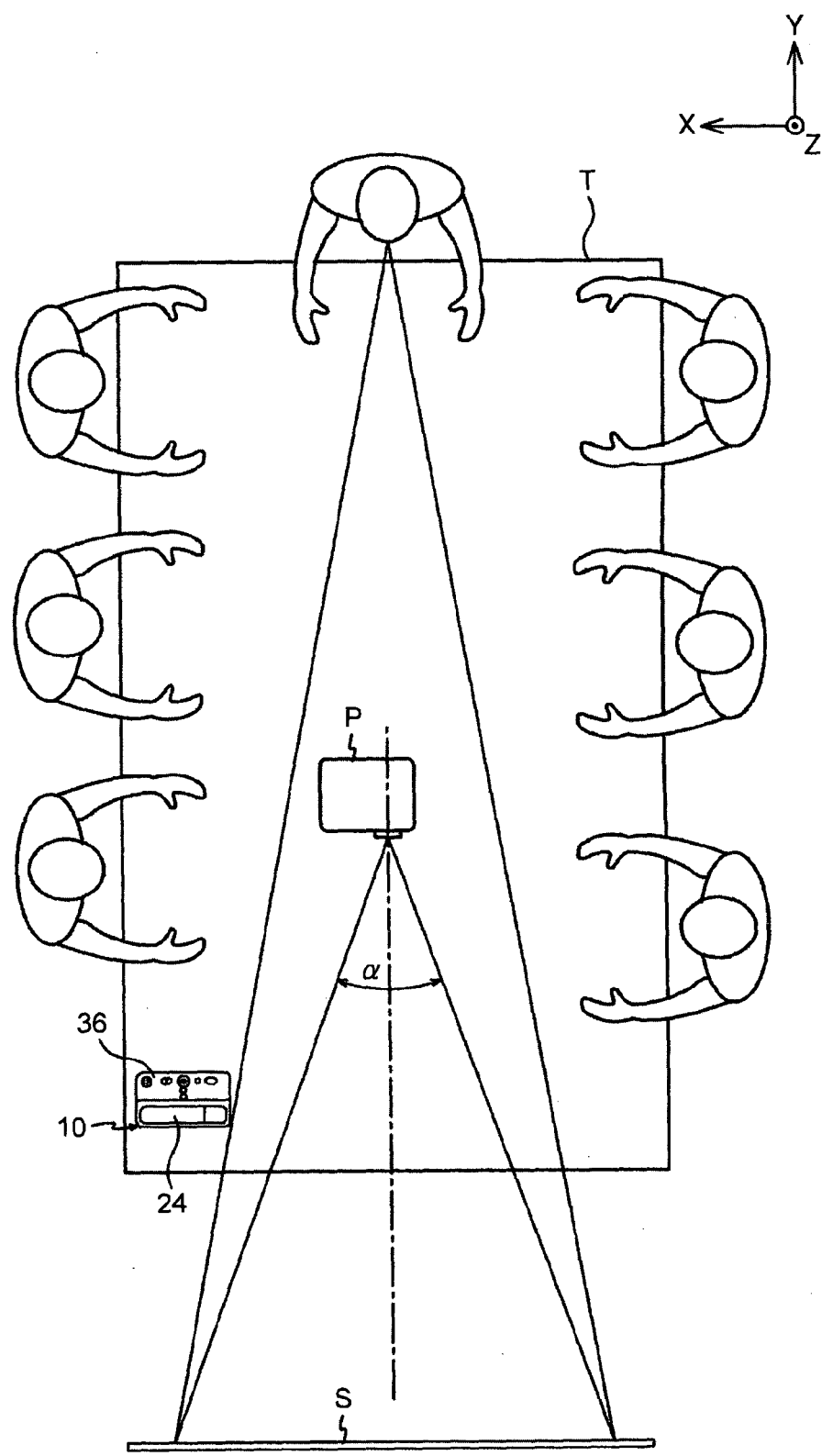
FIG. 13 is a diagram for explaining a video teleconference session carried out using the video teleconference devices.

As illustrated in FIG. 13, a plurality of (for example, seven) members of a group are seated facing, for example, a table T, which has the shape of a planar rectangle with the Y direction as the longitudinal direction and which is placed in a conference room. With respect to the table T, the members are seated at the +X direction side, the −X direction side, and the +Y direction side.

In the center of the table T, there is installed the projector P in such a manner that images can be projected on the screen S that is placed obliquely upward at the −Y direction side and the +Z direction side of the table T.

The video teleconference device 10 may be mounted or placed on the table in a state that the image input unit 24 is at the housed position, for example, on a corner of the table T at the +X direction side and the −Y direction side (a position which is outside of the horizontal view angle α of the projector P and which does not hinder a person who sits at a position opposite to the screen S to view the image on the screen S), in such a manner that the operation panel 36 orients the +Y direction and the image input unit 24 orients the −Y direction.

Thus, the video teleconference device 10 is set so that the voice incorporating opening 20 orients the +Y direction and the voice discharging opening 43 orients obliquely upward at the +Z direction and the +Y direction. Therefore, the voices of all members of the corresponding group can be easily received as input by the microphone 17a, and the voice output from the speaker 15a can be easily heard by all members of the corresponding group.

Along with the placement or installation of the video teleconference device 10 as mentioned above, the wiring connection of the electricity and communication for the video teleconference device 10 is set, including for example a wire connection between a power jack 60 and the power source, a wire connection between LAN terminals 51, 57 and a terminal for Internet connection, a wire connection between the image output terminal 55 and a terminal of the projector P, and so on.

Subsequently, a user (a member of one group) presses the lock releasing button 33 (see FIG. 3) to release the image input unit 24 from the locked status with the housing 25. At this time, due to the popup function of the uniaxial hinge device 67, the image input unit 24 projects by a predetermined extent from the housing 25 with rotating around the third shaft line with respect to the housing 25 (see FIG. 8).

Figure 9:
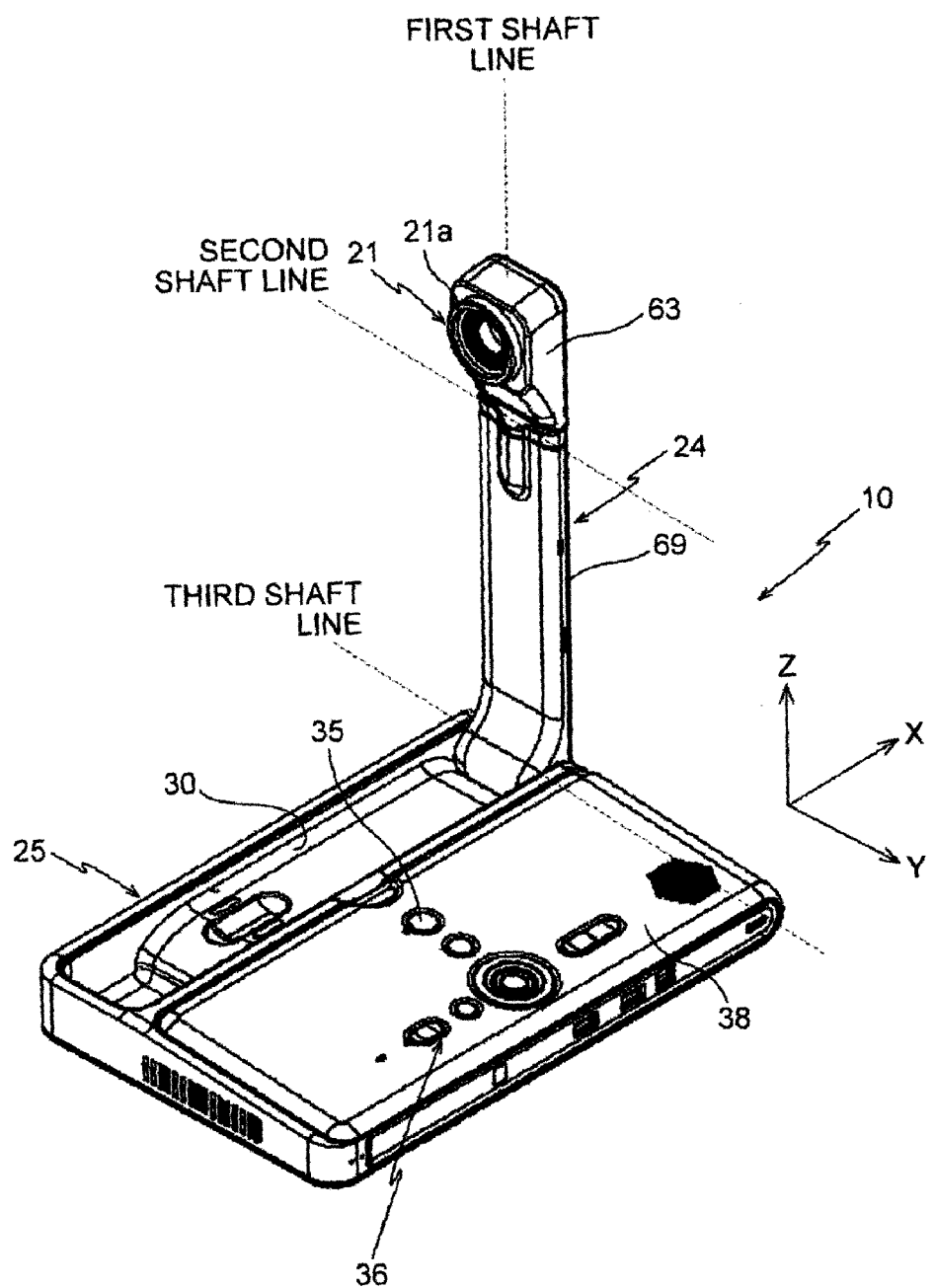
FIG. 9 is a diagram (second) for explaining the operations performed by the image input device.

There, the user holds the image input unit 24 in a hand and manually turns the image input unit 24 around the third shaft line until the total rotation angle of the image input unit 24 reaches, for example, 90° (see FIG. 9). The user also manually turns the camera housing 63 around the first shaft line and the second shaft line, respectively as appropriate, so that the electronic camera 21 is positioned at the position at which, for example, all members of that group are within the field of view of the electronic camera 21.

Then, a user presses the power button 35 (see FIG. 10) and starts up the video teleconference device 10. In response, the fan 19c of the cooling system 19 (see FIG. 2) operates so that the air enters the housing 25 via the air inlet 59, passes by the heat sink 19b, and goes out of the housing 25 via the exhaust outlet 53.

When the video teleconference device 10 is started, it gets connected to a predetermined server over the Internet and receives form that server an address list of other video teleconference devices 10. Upon receiving the address list, the video teleconference device 10 displays it on the screen S via the projector P. Then, a user operates the cursor 40 and selects, from the address list, another video teleconference device 10 with which a video teleconference session is to be carried out. That is followed by the pressing of the decision button 39 so as to finalize the other video teleconference device 10. In that case, in the selected/finalized video teleconference device 10 connected to the aforementioned server, when the corresponding group performs an operation of accepting the request for communication, the Internet connection is established between the two video teleconference devices 10.

In this way, when the Internet connection is established between the two video teleconference devices 10, the figures (images) of all members of the group captured by the electronic camera 21 of the first of the two video teleconference devices 10 are sent to the second video teleconference device 10, which is possessed by another group for communication, via the Internet and are projected on the screen S via the projector P connected to the second video teleconference device 10. Similarly, the figures (images) of all members of the group captured by the electronic camera 21 of the second video teleconference device 10 are sent to the first video teleconference device 10 via the Internet and are projected on the screen S via the projector P connected to the first video teleconference device 10.

Then, the voice of the group possessing the first video teleconference device 10 is input via the corresponding microphone 17a and is then transmitted to the second video teleconference device 10 via the Internet. In the second video teleconference device 10, the received voice is output from the corresponding speaker 15a. Similarly, the voice of the group possessing the second video teleconference device 10 is input via the corresponding microphone 17a and is then transmitted to the first video teleconference device 10 via the Internet. In the first video teleconference device 10, the received voice is output from the corresponding speaker 15a.

At that time, as described above, the voice of the group possessing the second video teleconference device 10 that is output from the speaker 15a of the first video teleconference device 10 is not easily received as input by the microphone 17a of the first video teleconference device 10. As a result, a situation is prevented in which the voice of the group possessing the second video teleconference device 10 is output from the speaker 15a of the same second video teleconference device 10. That is, the echo effect is prevented from occurring; and, by extension, the howling effect that may occur by the repetition of the echo effect is also prevented from occurring.

Similarly, the voice of the group possessing the first video teleconference device 10 that is output from the speaker 15a of the second video teleconference device 10 is not easily received as input by the microphone 17a of the second video teleconference device 10. As a result, a situation is prevented in which the voice of the group possessing the first video teleconference device 10 is output from the speaker 15a of the same first video teleconference device 10. That is, the echo effect is prevented from occurring; and, by extension, the howling effect that may occur by the repetition of the echo effect is also prevented from occurring.

Moreover, as described above, the suction noise and the exhaust sound of the fan 19c in the first video teleconference device 10 is not easily received as input by the microphone 17a. As a result, the suction noise and the exhaust sound are prevented from being transmitted as noise to the other video teleconference device 10. Furthermore, as described earlier, the operating sound of the fan 19c or the sound leaking from the voice output device 15 inside the housing 25 is also not easily received as input by the microphone 17a. As a result, those sounds are prevented from being transmitted as noise to the other video teleconference device 10.

Thus, in both the video teleconference devices 10, it becomes possible to effectively curb the echo effect and the howling effect. Moreover, in each of the two video teleconference devices 10, the noise mentioned above is prevented from being received as input by the corresponding microphone 17a. Hence, among the two video teleconference devices 10, a video teleconference session including two-way communication of high-quality voice can be carried out.

In this way, a video teleconference session is carried out by means of two-way communication of images and voice.

Meanwhile, before the start of a video teleconference session and during when the video teleconference session is going on, a user appropriately operates the pair of volume buttons 41a and 41b to adjust the volume level of the voice coming out of the speaker 15a, or appropriately presses the microphone mute button 47 so as to prevent the voice of the own members from being output to the other group. Besides, a user appropriately operates the menu button 45 to call the menu screen on the screen S, and then performs the desired functions by operating the cursor 40 and the decision button 39 and selecting/finalizing items on the menu screen.

Meanwhile, in case the group at the other end of communication is to be changed, the user presses the line button 37 to cut off the Internet connection that is currently established with another video teleconference device 10. At that time, the menu screen is displayed on the screen S and the address list mentioned above is displayed in the menu screen. Then, in an identical manner to that described above, a user operates the cursor 40 and the decision button 39 of the first video teleconference device 10, and selects/finalizes the video teleconference device 10 with which the next video teleconference session is to be carried out. Then, in the video teleconference device 10 that is selected/finalized, in an identical manner to that described above, when the operation of accepting two-way communication is performed, a two-way communication of images and voice starts among the two video teleconference devices 10. Subsequently, the video teleconference session is carried out in an identical manner to that described above.

When the video teleconference session is over, a user presses the power button 35 to cut off the power supply to the corresponding video teleconference device 10. By pressing the power button 35 in that manner, the video teleconference device 10 can be shut down, thereby ending the communication with another device. Then, the user appropriately turns the camera housing 63 with respect to the arm 69 around the first shaft line and the second shaft line, and returns the image input unit 24 in the reference state. Then, the image input unit 24 in the reference state is turned around the third shaft line and housed in the housing 25. While being housed in the housing 25, the image input unit 24 gets locked with respect to the housing 25 due to the action of the locking device mentioned above. Once the image input unit 24 is housed in the housing 25, the video teleconference device 10 looks almost like a flat plate of the A4 size when viewed in a planar view.

Meanwhile, for example, even if the projector P is replaced with a liquid crystal monitor or a liquid crystal television as an image output device in the video teleconference device 10, the usage thereof is identical to that described above.

As explained above, in the video teleconference device 10 according to the present embodiment, the speaker 15a and the microphone 17a are arranged with respect to the housing 25 in such a manner that the projected image on a predetermined plane (YZ plane) of the shaft line of the speaker 15a and the projected image on a predetermined plane (YZ plane) of the shaft line of the microphone 17a are roughly orthogonal to each other. With such a simple configuration, it becomes possible to effectively curb the echo effect and the howling effect.

In other words, in the video teleconference device 10, the speaker 15a and the microphone 17a are so arranged in the housing 25 that the voice output direction of the speaker 15a and the voice input direction of the microphone 17a are roughly orthogonal to each other. With such a simple configuration, it becomes possible to effectively curb the echo effect and the howling effect.

Moreover, in the video teleconference device 10, on the upper wall of the housing 25 (i.e., on the operation panel 36), the voice discharging opening 43 is formed to discharge the voice that has been output from the speaker 15a; while on the side wall at the +Y direction side that is lying next to the upper wall of the housing 25, the voice incorporating opening 20 is formed to incorporate the voice that is then received as input by the microphone 17a. With such a simple configuration, it becomes possible to effectively curb the echo effect and the howling effect.

Furthermore, in the video teleconference device 10, the speaker 15a is disposed with respect to the housing 25 in such a manner that the voice output direction of the speaker 15a is roughly upward (including obliquely upward). As a result, a person located at any position around the video teleconference device 10 can easily hear the voice output from the speaker 15a.

Moreover, in the video teleconference device 10, the speaker 15a is disposed in a slightly tilted manner so that the +Y direction side is lower than the −Y direction side in its height, and the microphone 17a is disposed in such a manner that the voice input direction thereof orients roughly the −Y direction. Thus, if the members participating in the conference are positioned roughly at the +Y direction side of the video teleconference device 10, the voices of the those members can be extremely easily received as input by the microphone 17a, and the voice output from the speaker 15a can be easily heard by the members.

Meanwhile, in the video teleconference device 10, inside the compact and thin housing 25 having the shape of a substantially flat plate, the speaker 15a and the microphone 17a are disposed relatively close to each other. Even with such an arrangement of the speaker 15a and the microphone 17a according to the present embodiment, it becomes possible to effectively curb the echo effect and the howling effect.

Moreover, the voice discharging opening 43 is formed at the corner between the sides in the +X direction and the +Y direction of the upper wall of the housing 25 (i.e., the operation panel 36). That is, the voice discharging opening 43 is formed in the same line in which the pair of volume buttons 41a and 41b, the decision button 39, the menu button 45, and the microphone mute button 47 are arranged (see FIG. 3). That contributes in enhancing the oneness of the appearance (design).

Meanwhile, although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

In the present embodiment, the angle θ is set to 85.4°. However, that is not the only possible case. As long as the angle θ is in the range of 80° or more and 100° or less, the purpose is served (i.e., as long as the voice output direction of the speaker 15a is roughly orthogonal to the voice input direction of the microphone 17a, the purpose is served). If the angle θ is within the aforementioned range (80° or more to 100° or less), a person located at any position around the video teleconference device 10 can relatively easily hear the voice output from the speaker 15a. Besides, the voice coming out of the speaker 15a is not easily received as input by the microphone 17a. Thus, irrespective of the positional relationship between the video teleconference device 10 and the person, the echo effect or the howling effect can be effectively curbed while almost capitalizing on the function of the speaker 15a. Moreover, as described earlier, from the perspective of capitalizing on the functions of the microphone 17a and the speaker 15a as well as effectively curbing the echo effect or the howling effect, it is desirable that the angle θ is in the range of 80° or more and 90° or less, i.e., it is desirable that the speaker 15a is tilted in such a manner that the side thereof on the +Y direction is at a lower level than the side thereof on the −Y direction. Furthermore, it is also desirable that the angle of gradient of the operation panel 36 with respect to the XY plane is, for example, (90°-θ). That is, it is desirable that the direction of formation of the through holes 43a, which constitute the voice discharging opening 43, is parallel to the shaft of the speaker 15a.

In the present embodiment, the voice incorporating opening 20 is formed on the side wall at the +Y direction side of the housing 25. However, that is not the only possible case. Alternatively, for example, the voice incorporating opening 20 can be formed on another wall (i.e., on a wall other than the side wall at the +Y direction side) of the housing 25. In that case, it is desirable that the voice discharging opening 43 is formed on a neighboring wall of the wall on which the voice incorporating opening 20 is formed. With that, it can be ensured not only that the projected images on a predetermined plane (for example, the XY plane, the YZ plane, or the XZ plane) of the shaft lines of the speaker 15a and the microphone 17a are orthogonal to each other; but also that the microphone 17a is positioned adjacent to the voice incorporating opening 20 but positioned away from the voice output direction of the speaker 15a and that the speaker 15a is positioned adjacent to the voice discharging opening 43. In such a case, if the voice incorporating opening 20 is formed on the upper wall of the housing 25, that is, if the voice input direction of the microphone 17a is made to be roughly downward (including obliquely downward); the voice of a person located at any position around the video teleconference device 10 can be easily received as input by the microphone 17a. Moreover, if the voice discharging opening 43 is formed on the upper wall of the housing 25, that is, if the voice output direction of the speaker 15a is made to be roughly upward (including obliquely upward); a person located at any position around the video teleconference device 10 can easily hear the voice output from the speaker 15a.

In the present embodiment, the voice discharging opening 43 is formed on the upper wall at the +Y direction side of the housing 25. However, that is not the only possible case. Alternatively, for example, the voice discharging opening 43 can be formed on another wall (i.e., on a wall other than the upper wall) of the housing 25. In that case, it is desirable that the voice incorporating opening 20 is formed on a neighboring wall of the wall on which the voice discharging opening 43 is formed. With that, it can be ensured not only that the projected images on a predetermined plane (for example, the XY plane, the YZ plane, or the XZ plane) of the shaft lines of the speaker 15a and the microphone 17a are orthogonal to each other; but also that the microphone 17a is positioned adjacent to the voice incorporating opening 20 but positioned away from the voice output direction of the speaker 15a and that the speaker 15a is positioned adjacent to the voice discharging opening 43. In such a case, if the voice incorporating opening 20 is formed on the upper wall of the housing 25, that is, if the voice input direction of the microphone 17a is made to be roughly downward (including obliquely downward); the voice of a person located at any position around the video teleconference device 10 can be easily received as input by the microphone 17a.

In the present embodiment, the voice discharging opening 43 is formed at the corner between the sides in the +X direction and the +Y direction of the upper wall of the housing 25 (i.e., the operation panel 36). However, that is not the only possible case, and the voice discharging opening 43 can be formed at another location (i.e., at a location at which none of the operating buttons and the cursor 40 is disposed) on the operation panel 36. In that case, the speaker 15a needs to be disposed at a position corresponding to the voice discharging opening 43.

In the present embodiment, the voice incorporating opening 20 is formed at the +X direction side end of the side wall at the +Y direction side of the housing 25. However, that is not the only possible case. Alternatively, for example, the voice incorporating opening 20 can formed either at the end of the –X direction side of the side wall at the +Y direction side of the housing 25 or in the middle part along the X direction of the side wall at the +Y direction side of the housing 25. In that case, the microphone 17a needs to be disposed at a position corresponding to the voice incorporating opening 20.

In the present embodiment, the air inlet 59 is formed on the lower wall of the housing 25. However, that is not the only possible case. In short, the air inlet 59 can be formed on any wall (for example, the side wall at the +Y direction side) of the housing 25 except for the wall on which the voice incorporating opening 20 is formed. In this case, it is desirable that the exhaust outlet 53 is formed on a wall other than the walls on which the air inlet 59 and the voice incorporating opening 20 are formed. Moreover, in this case, at least the configuration or the positioning of the fan 19c needs to be modified according to the positions of the air inlet 59 and the exhaust outlet 53.

In the present embodiment, the exhaust outlet 53 is formed on the side wall at the –X direction side of the housing 25. However, that is not the only possible case. In short, the exhaust outlet 53 can be formed on any wall (for example, the side wall at the +Y direction side) of the housing 25 except for the wall on which the voice incorporating opening 20 is formed. In this case, it is desirable that the air inlet 59 is formed on a wall other than the walls on which the exhaust outlet 53 and the voice incorporating opening 20 are formed. Moreover, in this case, at least the configuration or the positioning of the fan 19c needs to be modified according to the positions of the air inlet 59 and the exhaust outlet 53. Particularly, if the exhaust outlet 53 is formed at the end of the –X direction side of the side wall at the –Y direction side, then the air can be discharged to the rear side (i.e., the –Y direction side) of the housing 25 from the farthest position from the microphone 17a (i.e., from the farthest position from the –Y direction side and the –X direction side of the microphone 17a). As a result, the exhaust sound of the fan 19c (including the wind roar at the exhaust outlet 53) is further prevented from being received as input by the microphone 17a.

In the present embodiment, the holding member 18 is disposed for the purpose of spatially secluding the microphone 17a from the voice output device 15 and the fan 19c in the housing 25. In addition to or in place of the holding member 18, a shielding member can be formed on at least one of the upper cover 27 and the lower cover 29 constituting the housing 25 in such a manner that the shielding member spatially secludes the microphone 17a from the voice output device 15 and the fan 19c in the housing 25. Thus, in the case of using the holding member 18, at least one of the upper cover 27 and the lower cover 29 can be formed to have the shielding function. On the other hand, in the case of not using the holding member 18; at least one of the upper cover 27 and the lower cover 29 can be used to hold the holder 17b at the housing 25 via a shock-absorbing member as a buffer, and the upper cover 27 and the lower cover 29 can be formed to have the shielding function as well as the holding function.

In the present embodiment, the housing 25 has the shape of a rectangular flat plate when viewed in a planar view. However, that is not the only possible case. Alternatively, for example, the housing 25 can also have the shape of a polygonal flat plate (other than the rectangular shape), a round flat plate, or an elliptical flat plate when viewed in a planar view with the vertical direction as the thickness direction.

In the present embodiment, the housing 25 has the shape of a substantially rectangular parallelepiped. However, that is not the only possible case. Alternatively, for example, the housing 25 can also have a polygonal columnar shape (other than a rectangular parallelepiped shape), a circular cylindrical shape, or an elliptic cylindrical shape. In short, the housing 25 can be made of a member having at least two neighboring walls.

In the present embodiment, as a plurality of video teleconference devices performing two-way communication, the video teleconference devices 10 are used. However, that is not the only possible case. Alternatively, for example, one of the video teleconference devices can be the video teleconference device 10, while the other video teleconference device can be a video teleconference device having a different configuration. In that case, if the voice of the group, which possesses the video teleconference device 10, output from the speaker of the other video teleconference device is received as input by the microphone of the other video teleconference device, then the voice of the group possessing the video teleconference device 10 gets output from the speaker 15a (thereby causing the echo effect). Even then, since that voice output from the speaker 15a is not easily received as input by the microphone 17a, repetition of the echo effect is prevented and, by extension, the howling effect is prevented from occurring.

In the present embodiment, as the microphone 17a, a compact omnidirectional microphone is used. Instead, it is also possible to use a directional microphone.

In the present embodiment, the microphone 17a has a circular cylindrical shape. Instead, it is also possible to have the microphone 17a in another shape.

In the present embodiment, the voice incorporating opening 20 is formed from a plurality of the through holes 20a arranged (in a line) in the X direction. However, that is not the only possible case. Alternatively, for example, the through holes 20a can be formed corresponding to the vertices of a polygon. In that case, it is desirable that the shaft line of the microphone 17a passes through the center of that polygon.

In the present embodiment, as the speaker 15a, a full range type speaker is used. However, that is not the only possible case. Alternatively, for example, a multi-way speaker can also be used.

In the present embodiment, as the speaker 15a, a round-shaped speaker is used. However, that is not the only possible case. Alternatively, for example, a speaker of another shape can also be used.

In the present embodiment, the microphone 17a is attached to the internal face of a side wall of the housing 25. However, that is not the only possible case. Alternatively, the microphone 17a can be attached to the external face of a side wall of the housing 25 or can be fit in or built in a side wall of the housing 25.

In the present embodiment, the speaker 15a is disposed beneath the upper wall of the housing 25. However, that is not the only possible case. Alternatively, for example, the speaker 15a can be attached to the lower face or the upper face of the upper wall of the housing 25 or can be fit in or built in the upper wall of the housing 25.

In the present embodiment, the video teleconference device 10 is used, for example, in a conference room. However, that is not the only possible case. As described above, the video teleconference device 10 is configured to be compact and slim with excellent portability. Hence, the video teleconference device 10 is not confined to be stationary in a specific conference room, but can be expected to be freely carried around and used at various locations. Thus, the video teleconference device 10 is extremely rich in the utility factor.

In the present embodiment, the present invention is implemented in the video teleconference device 10 of a portable type. In addition, the present invention can also be implemented in the video teleconference device of a stationary type.

In the present embodiment, as an example of a video teleconference device, the explanation is given for the video teleconference device 10 that enables transmission and reception (two-way communication) of images and voice (sound). However, that is not the only possible case. Alternatively, for example, the present invention can also be applied to a device that enables only transmission of images but enables transmission and reception of voice; or to a device that enables only reception of images but enables transmission and reception of voice; or to a device that enables transmission and reception of only voice.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

The invention claimed is:

1. A conference device comprising:
   a communication unit configured to transmit and receive sound data at least via a communication network;
   a housing configured to accommodate the communication unit;
   a microphone configured to input sound as the sound data to be transmitted by the communication unit; and
   a speaker configured to output sound as the sound data received by the communication unit, wherein
   the microphone and the speaker are placed in the housing so that a sound input direction of the microphone, when the microphone is operational, and a sound output direction of the speaker, when the speaker is operational, are substantially orthogonal to each other.

2. A conference device comprising:
   a communication unit configured to transmit and receive sound data at least via a communication network;
   a housing configured to accommodate the communication unit, the housing having a substantially cubic shape;
   a microphone configured to input sound as the sound data to be transmitted by the communication unit; and
   a speaker configured to output sound as the sound data received by the communication unit, wherein
   a sound inlet opening to inlet the sound which is input from the microphone, when the microphone is operational, is formed on a wall of the housing, a sound outlet opening to output the sound which is output from the speaker, when the speaker is operational, is formed on another wall of the housing, the wall and the another wall are adjacent to each other.

3. The conference device according to claim 2, wherein
   either one of the sound inlet opening and the sound outlet opening is formed on an upper wall of the housing, and the other one of the sound inlet opening and the sound outlet opening is formed on a side wall of the housing.

4. The conference device according to claim 1, wherein
   at least one of the microphone and the speaker is attached to the housing via a buffer.

5. The conference device according to claim 1, further comprising
   a cooling system configured to cool a heating element in the housing, wherein
   the cooling system is placed in the housing,
   the cooling system includes
   a heat dissipator configured to dissipate heat from the heating element to an outside of the housing, and
   an air flow generating unit including a fan to generate an air flow which passes through an inside of the housing via the heat dissipator, and
   the sound input direction of the microphone is out of a path of the air flow.

6. The conference device according to claim 5, wherein
   the microphone is spatially isolated from the speaker and the fan in the housing.

7. The conference device according to claim 1, wherein
   the housing comprises a substantially flat plate-like body having a thickness in a vertical direction.

8. The conference device according to claim 1, further comprising:
   a video camera,
   wherein the microphone is embedded in a first surface of the housing, the speaker is embedded in a second surface of the housing, and an intersection point of the first surface of the housing and the second surface of the housing which is between the microphone and the speaker is a convex exterior surface of the housing, and the video camera is disposed separately from either of the first surface and the second surface when the video camera is operational.

* * * * *